United States Patent
Nguyen et al.

(10) Patent No.: US 12,368,424 B2
(45) Date of Patent: Jul. 22, 2025

(54) HIGH ELECTROMECHANICAL COUPLING STRENGTH HOLLOW DISK RESONATORS

(71) Applicant: THE REGENTS OF THE UNIVERSITY OF CALIFORNIA, Oakland, CA (US)

(72) Inventors: Clark T.-C. Nguyen, Oakland, CA (US); Yafei Li, Albany, CA (US); Alper Ozgurluk, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 806 days.

(21) Appl. No.: 17/097,561

(22) Filed: Nov. 13, 2020

(65) Prior Publication Data

US 2021/0159868 A1 May 27, 2021

Related U.S. Application Data

(63) Continuation of application No. PCT/US2019/033007, filed on May 17, 2019.
(Continued)

(51) Int. Cl.
*H03H 9/02* (2006.01)
*H03H 3/007* (2006.01)
(Continued)

(52) U.S. Cl.
CPC ...... *H03H 3/0072* (2013.01); *H03H 9/02157* (2013.01); *H03H 9/02228* (2013.01);
(Continued)

(58) Field of Classification Search
CPC ............ H03H 9/02157; H03H 9/2405; H03H 9/2431; H03H 9/2436; H03H 9/505
See application file for complete search history.

(56) References Cited

U.S. PATENT DOCUMENTS 7,295,088 B2 * 11/2007 Nguyen ............... H03H 9/2431
333/186
9,091,544 B2 * 7/2015 Johari-Galle ...... G01C 19/5698
(Continued)

FOREIGN PATENT DOCUMENTS

WO 2019226498 A1 11/2019

OTHER PUBLICATIONS

ISA/KR, Korean Intellectual Property Office (KIPO), International Search Report and Written Opinion Issued Sep. 27, 2019, related PCT international application No. PCT/US2019/033007, pp. 1-13, claims searched, pp. 14-18.

*Primary Examiner* — Andrea Lindgren Baltzell
*Assistant Examiner* — Alan Wong
(74) *Attorney, Agent, or Firm* — O'BANION & RITCHEY LLP; John P. O'Banion

(57) ABSTRACT

System and methods for a hollow-disk radial-contour mode resonator structure. The hollow disk reduces the dynamic mass and stiffness of the structure. Since electromechanical coupling $C_x/C_o$ goes as the reciprocal of mass and stiffness, the hollow disk structure has a considerably stronger electromechanical coupling than a solid one at the same frequency, and thus raises $C_x/C_o$ without excessive gap-scaling. Several embodiments of hollow disk resonators are detailed, including asymmetric and symmetric disk configurations.

15 Claims, 13 Drawing Sheets

Related U.S. Application Data

(60) Provisional application No. 62/673,886, filed on May 19, 2018.

(51) Int. Cl.
*H03H 9/24* (2006.01)
*H03H 9/50* (2006.01)

(52) U.S. Cl.
CPC ........ *H03H 9/2431* (2013.01); *H03H 9/2436* (2013.01); *H03H 9/505* (2013.01); *H03H 2009/02527* (2013.01)

(56) References Cited

U.S. PATENT DOCUMENTS

| | | | |
|---|---|---|---|
| 9,112,477 B2 * | 8/2015 | Bahriz | H03H 9/2452 |
| 9,599,470 B1 * | 3/2017 | Kirby | G01C 19/5691 |
| 9,866,172 B2 * | 1/2018 | Nguyen | H03B 5/1835 |
| 9,991,868 B1 * | 6/2018 | Nguyen | G01C 19/5691 |
| 10,393,525 B2 * | 8/2019 | Ayazi | G01C 19/5712 |
| 10,422,641 B1 * | 9/2019 | Perahia | G01C 19/5691 |
| 11,209,325 B2 * | 12/2021 | Cavalloni | H10N 30/505 |
| 2005/0206479 A1 | 9/2005 | Nguyen | |
| 2010/0321132 A1 | 12/2010 | Park | |
| 2013/0214461 A1 | 8/2013 | Shkel | |
| 2016/0164458 A1 * | 6/2016 | Nguyen | H01P 1/39 |
| | | | 331/154 |
| 2016/0344368 A1 | 11/2016 | Ayazi | |

\* cited by examiner

HIGH ELECTROMECHANICAL COUPLING STRENGTH HOLLOW DISK RESONATORS

CROSS-REFERENCE TO RELATED APPLICATIONS

This application claims priority to, and is a 35 U.S.C. § 111(a) continuation of, PCT international application number PCT/US2019/033007 filed on May 17, 2019, incorporated herein by reference in its entirety, which claims priority to, and the benefit of, U.S. provisional patent application Ser. No. 62/673,886 filed on May 19, 2018, incorporated herein by reference in its entirety. Priority is claimed to each of the foregoing applications.

The above-referenced PCT international application was published as PCT International Publication No. WO 2019/226498 A1 on Nov. 28, 2019, which publication is incorporated herein by reference in its entirety.

STATEMENT REGARDING FEDERALLY SPONSORED RESEARCH OR DEVELOPMENT

This invention was made with Government support under Grant Number HR0011-15-2-0052 awarded by the Department of Defense Advanced Research Projects Agency (DARPA). The Government has certain rights in the invention.

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to microelectromechanical system (MEMS) resonators, and more particularly to hollow-disk MEMS resonators.

2. Background Discussion

The growing need for high performance and wide bandwidth handheld mobile devices capable of operating at various communication bands has spurred the use of microelectromechanical system (MEMS) resonators having simultaneous high resonance frequency ($f_o$), high quality factor (Q) and high electromechanical coupling, as gauged by the motional-to-static capacitive ratio ($C_x/C_o$). These well-known but mostly competing requirements have driven research efforts on different transduction mechanisms. Among these, piezoelectric and film bulk acoustic resonators (FBAR) have achieved electromechanical coupling coefficients larger than 6%, but their Qs are smaller than desired.

Capacitive-gap transduced resonators have provided some of the highest disk $C_x/C_o$-Q products to date at high frequency (HF) and low to very high frequency (VHF). Attaining similar performance at the high-VHF and ultra-high frequency (UHF) ranges, however, is more difficult, as it requires either high voltage or electrode-to-resonator gaps considerably smaller than previously demonstrated.

BRIEF SUMMARY

One aspect of the present description is a system and method that raises $C_x/C_o$ without excessive gap-scaling or high voltage by hollowing out a disk resonator structure, which reduces the dynamic mass and stiffness of the structure. Since $C_x/C_o$ goes as the reciprocal of mass and stiffness, a hollow disk can have considerably stronger electromechanical coupling than a solid one at the same frequency. Several embodiments of hollow disk resonators are detailed, including asymmetric and symmetric disk configurations.

In one embodiment, mass and stiffness reduction is achieved from hollowing out a capacitive-gap transduced radial mode disk resonator, while maintaining resonance frequency and transduction area. This has enabled a measured electromechanical coupling strength ($C_x/C_o$) of 0.75% at 123 MHz without the need to scale the device's meager 40-nm electrode-to-resonator gap, resulting in nearly a 7-fold improvement in $C_x/C_o$ compared with a conventional radial contour-mode disk at the same frequency, same dc bias, and same gap. Such an increase in $C_x/C_o$ improves the passbands of channel-select filters targeted for low power wireless transceivers, as well as lower the power consumption of MEMS-based oscillators.

A fabrication process is also disclosed that deviates only slightly from a standard disk resonator process.

In an asymmetric hollow disk, a thin sidewall ring protrudes upward from the edges of an inner disk that itself anchors to the substrate via a center stem. The inner disk still vibrates in the radial contour mode in the radial direction. The sidewall vibrates in a radial cantilever mode, which boosts $C_x/C_o$ even higher.

In a symmetric hollow disk, the sidewall ring protrudes in both upwards and downwards directions along the inner disk edges. With a small stem anchor, the symmetry eliminates vertical vibration nonidealities, allowing for even better performance.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

Figure 1:
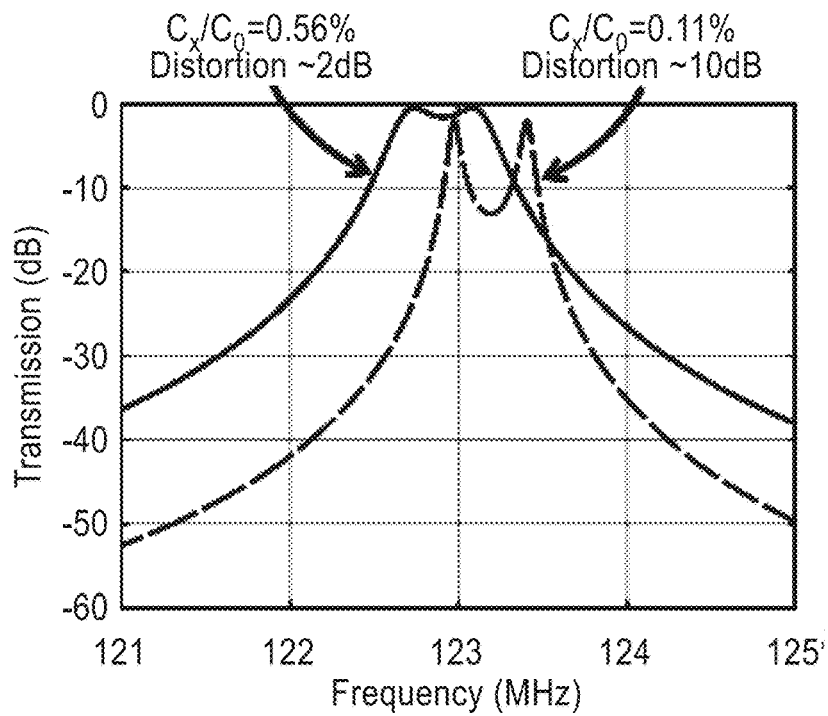
FIG. 1 is a plot illustrating simulated two-resonator filter frequency response curves.

The small electromechanical coupling $C_x/C_o$ of existing capacitive-gap transduced resonators at higher frequency complicates realization of radar oscillators and wider bandwidth filters. The systems and methods of the present description are directed to reducing the dynamic mass and stiffness of the resonator disk structures to raise $C_x/C_o$. FIG. 1 illustrates how raising $C_x/C_o$ from 0.11% to 0.56% corrects the passband distortion in a 123-MHz, 600-kHz bandwidth micromechanical filter.

1. Hollow-Disk Resonator Structure

Figure 2:
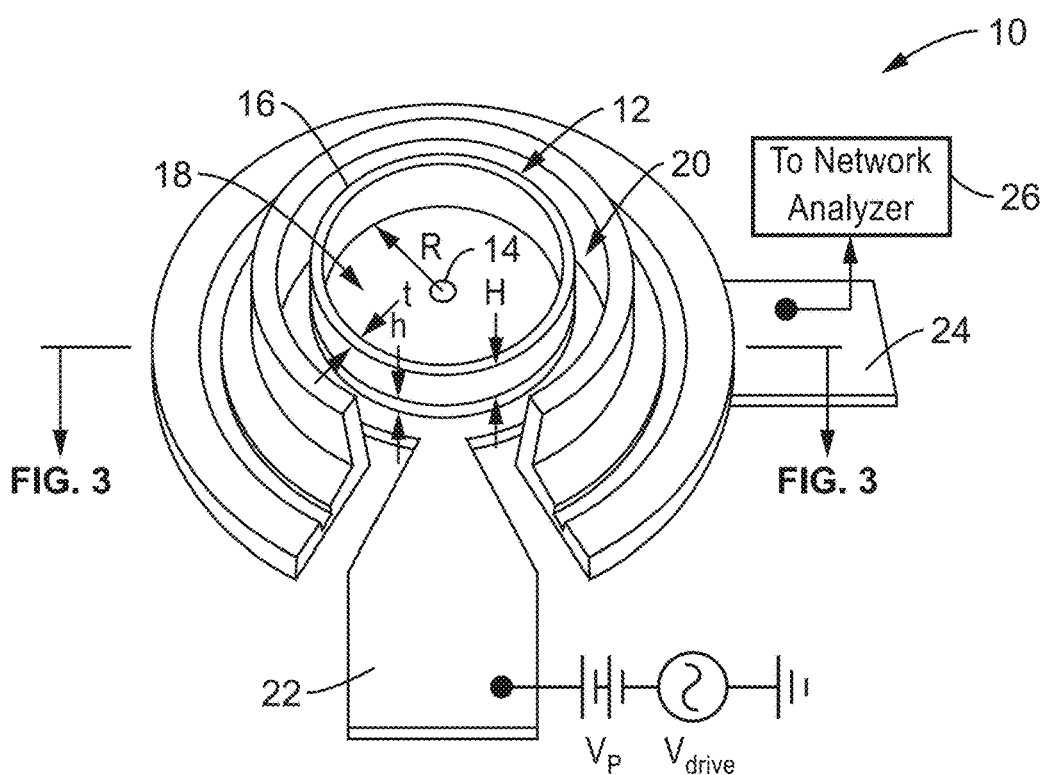
FIG. 2 is a perspective schematic view of an asymmetric hollow radial-mode disk resonator in accordance with the present description.
Figure 3:
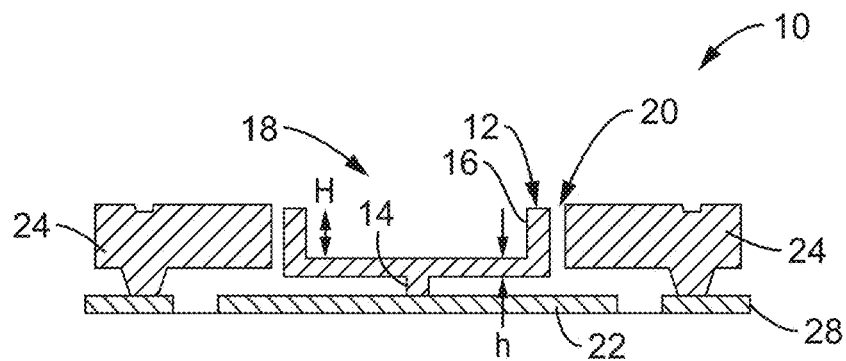
FIG. 3 is a sectional side view of the asymmetric hollow radial-mode disk resonator of FIG. 1.

FIG. 2 shows a perspective view of an asymmetric hollow-disk 12 radial contour-mode disk resonator 10 in a one-port drive and sense configuration. FIG. 3 shows a cross-section view of the resonator 10 of FIG. 2. A small signal voltage $V_{drive}$ atop dc-bias voltage $V_P$ creates a dynamic electrostatic force in the air gap 20 ($d_o$) between the disk 12 outer edge and electrode (drive electrode) 22 that drives the disk 12 into motion, with sizable displacement amplitudes ensuing when the drive frequency is at the disk resonance frequency. Electrode 24 is coupled for output to network analyzer 26. It should be appreciated, that one of ordinary skill in the art will recognize that the two electrodes are interchangeable in regards to which is the input (drive) electrode and which is the output (sense) electrode.

The resultant change in the overlap capacitance $C_o$ then creates an output current across the dc-biased time-varying capacitive gap that allows electrical detection of the device response. For a 123-MHz solid disk resonator design, with 22 μm radius and 40 nm gap, the typical output current with a Q of 20,000 is on the order of 17 pA for a $V_P$ and $V_{drive}$ of 10V and 10 mV, respectively.

The resonance frequency of a solid radial contour-mode disk takes the form:

$$f_o = \frac{K_{mat}}{2R}\sqrt{\frac{E}{\rho}} \qquad \text{Eq. 1}$$

where R is the disk radius, $K_{mat}$ is a parameter dependent upon material properties (0.654 for polysilicon), and E and ρ are the Young's modulus and Poisson ratio, respectively, of the structural material.

Pursuant to obtaining an expression for the electromechanical coupling, the motional capacitance takes the form:

$$C_x = \frac{\eta_e^2}{k_m} = \frac{\eta_e^2}{\omega_o^2 m_m} \qquad \text{Eq. 2}$$

where $k_m$ is effective mechanical stiffness, $m_m$ is equivalent mass, $\omega_o$ is radian resonance frequency, and ne is electromechanical turns ratio given as:

$$\eta_e = V_P \frac{C_o}{d_o} = V_P \frac{\varepsilon_o A_o}{d_o^2} \qquad \text{Eq. 3}$$

where $V_P$ is dc-bias voltage, $\varepsilon_o$ is free space permittivity, $A_o$ is electrode-to-resonator overlap area, and $d_o$ is electrode-to-resonator gap. It should be noted that in FIG. 2 through FIG. 5 the electrode is shown to fully overlap the disk resonator which maximizes $A_o$ toward maximizing $C_x$, as seen in Eq. 4.

Substituting Eq. 3 into Eq. 2 and dividing by overlap capacitance $C_o$ yields the $C_x/C_o$ expression for a radial contour-mode disk in terms of mechanical and electrical design parameters:

$$\frac{C_x}{C_o} = \frac{V_P^2}{k_m} \frac{\varepsilon_o A_o}{d_o^3} = \frac{V_P^2}{\omega_o^2 m_m} \frac{\varepsilon_o 2\pi R H_d}{d_o^3} \qquad \text{Eq. 4}$$

where $H_d$ is disk thickness.

Eq. 4 shows that for a given frequency a reduction in stiffness $k_m$ generally implies a simultaneous reduction in mass $m_m$. In other words, to attain higher $C_x/C_o$, mass may be removed.

As shown in FIG. 2 and FIG. 3, disk 12 is asymmetrically hollowed at depth H and radius (R−t) to generate a cylindrical void 18 at the center of the disk, forming an outer circumferential wall 16 having thickness t and bottom height or thickness h. Disk 12 is coupled to the polysilicon interconnect layer 28 via stem 14.

An asymmetric hollow disk (asymmetry is in the vertical direction in FIG. 3) tends to vibrate both radially and transversely. The transverse vibration of the inner disk introduces an extra dynamic mass moving in the vertical direction in the mechanical domain, which may affect the Q of the resonator by raising loss. A symmetric hollow disk can eliminate this nonideality.

Figure 4:
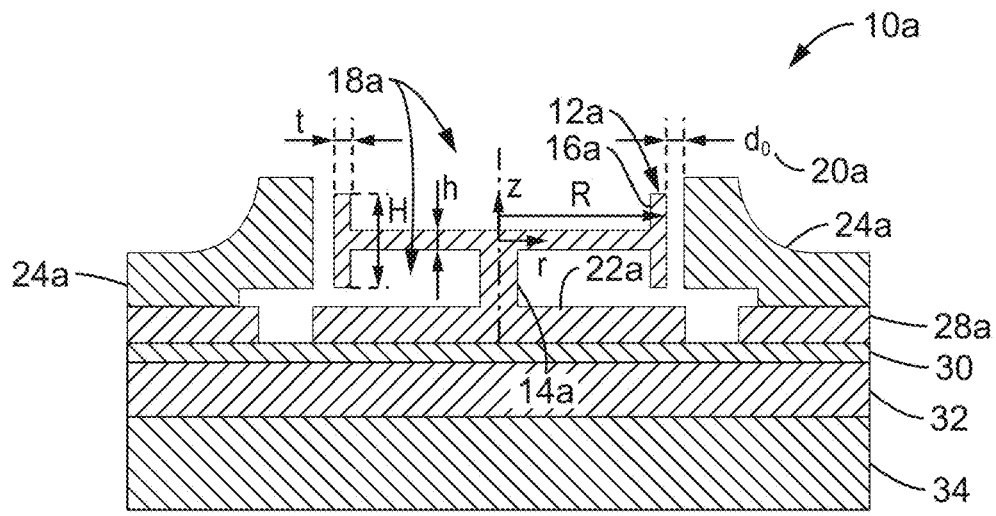
FIG. 4 is a sectional side view of an alternative symmetric hollow radial-mode disk resonator.

FIG. 4 is a schematic side section view of a symmetrically-hollow radial contour-mode disk resonator 10a with a fully surrounded electrode 22a. Electrode 24a is shown surrounding the disk resonator. Air gap 20a ($d_o$) is shown between the outer edge of disk 12a and electrode 24a. In this symmetric structure, upper and lower cylindrical voids 18a are generated at the center of the disk 12a (lower void 18a is annular due to stem 14a), creating a sidewall ring 16a that protrudes in both upwards and downwards directions along the inner disk edges. Disk 12a is coupled to the polysilicon interconnect layer 28a via stem 14a. Interconnect layer 28a is disposed on additional substrate layers comprising a SiN($Si_3N_4$) layer 30, $SiO_2$ layer 32 and Si layer 34. A similar substrate layer structure incorporating layers 30, 32 and 34 may be disposed below the interconnect layer 28 of resonator 10 shown in FIG. 2 and FIG. 3. As shown in FIG. 4, the hollow disk 12a is substantially symmetric in the vertical direction z.

Figure 5:
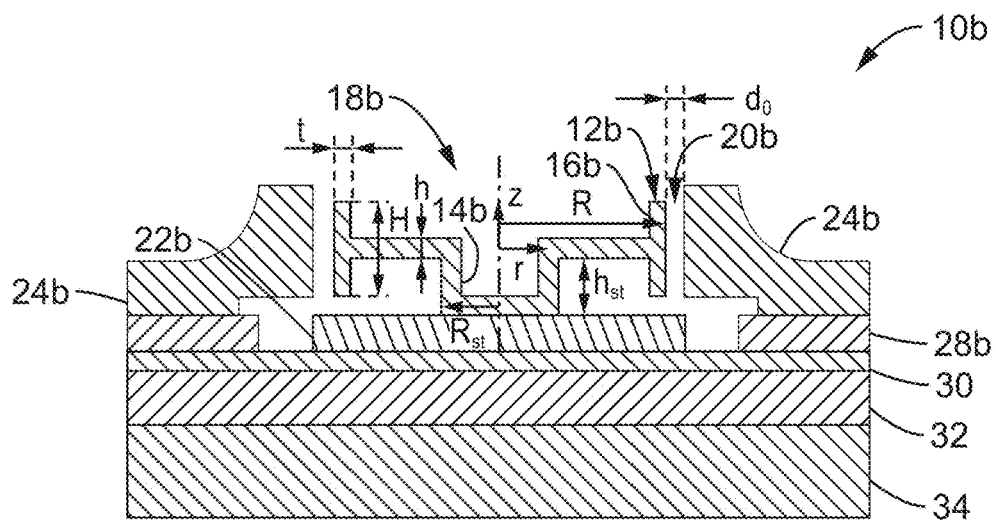
FIG. 5 is a sectional side view of a wide-stem symmetric hollow radial-mode disk resonator.

FIG. 5 is a schematic side section view of an alternative symmetrically-hollow radial contour-mode disk resonator 10b with wide or hollow stem 14b and fully surrounded electrode 22b. Air gap 20b ($d_o$) is shown between the outer edge of disk 12b edge and electrode 24b which surrounds the disk resonator. Upper and lower cylindrical voids 18b are generated at the center of the disk 12b (lower void 18b is annular due to stem 14b), creating a sidewall ring 16b that protrudes in both upwards and downwards directions along the inner disk edges. Stem 14b has a radius $R_{st}$ that is widened via use of an additional radial cavity below upper cavity 18b. Disk 12a is coupled to the polysilicon interconnect layer 28b via stem 14b. Interconnect layer 28b is disposed on additional substrate layers comprising a SiN ($Si_3N_4$) layer 30, $SiO_2$ layer 32 and Si layer 34.

The resonator structures (12, 12a, ad 12b) of the resonators 10, 10a and 10b shown in FIG. 2 through FIG. 5 are depicted as a circular disk in radial contour mode. While the circular shape and ring-shaped outer ring are preferred resonator structures in that the provide a robust structure with minimal mass at the periphery of the disk, it is appreciated that the resonator structure may comprise any shape, size or configuration. Any number, shape or size of cavities (e.g. in addition to or in replace of cavities 18, 18a and 18b) may be used to reduce the mass of the resonator structures. For example, the resonator structures 12, 12a and 12b may comprise a porous structure comprised of many small cavities of various or uniform sizing. Furthermore, the resonators 10, 10a and 10b may be configured to operate in whispering gallery mode or wine-glass mode as available in the art.

Furthermore, the resonators 10, 10a and 10b shown in FIG. 2 through FIG. 5 are depicted as having a drive electrode and a sense electrode. It is appreciated that these electrodes, or terminals, may be altered such that they are switched in position, the resonator structure itself acts as an electrode or terminal, and other electrode/terminal configurations and groupings may be used.

Referring back to FIG. 2, the hollow disk resonator 10 combines a regular (but very thin) bottom disk thickness h and of radius R with a high-aspect-ratio circular edge ring of width of t to provide more coupling to the electrodes. Mechanically, the bottom disk thickness h sets the stiffness, while the edge ring increases or maintains electrode-to-resonator overlap area while minimizing mass, thereby lowering the resonance frequency, which takes the form:

$$f_{oh} = \left\{ \frac{K_{mat}}{2R} \sqrt{\frac{E}{\rho}} \right\} \frac{1}{\sqrt{1 + \Delta m / m_{mh}}} \qquad \text{Eq. 5}$$

where the term in the bracket is the resonance frequency of a radial-contour mode disk as given in Eq. 1, $m_{mh}$ and $\Delta m$ are the equivalent dynamic disk mass at an edge location and the additional mass loading from the edge ring, respectively, given by:

$$m_{mh} = \chi \rho \pi R^2 h \qquad \text{Eq. 6}$$

$$\Delta m = \rho 2\pi R t H \qquad \text{Eq. 7}$$

Here $\chi$ is a factor relating the physical mass of the disk to its dynamic mass, which at the edge of a radial contour-mode resonance shape equals 0.763.

Substituting Eq. 6 and Eq. 7 into Eq. 5 leads to:

$$f_{oh} = \left\{ \frac{K_{mat}}{2R} \sqrt{\frac{E}{\rho}} \right\} \left\{ 1 + \frac{2}{\chi} \frac{t}{R} \frac{H}{h} \right\}^{-1/2} \qquad \text{Eq. 8}$$

Figure 6A:
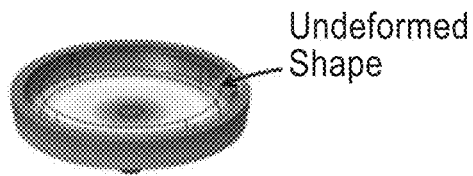
FIG. 6A and FIG. 6B show FEA-simulated mode shapes for the asymmetric hollow disk resonator for fully expanded and fully contracted modes, respectively.
Figure 6B:
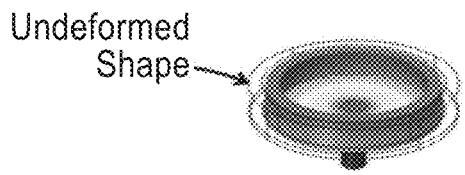

The vertically-constrained finite element analysis (FEA)-simulated mode shape in FIG. 6A and FIG. 6B does indeed resemble the mode shape of a conventional radial-contour mode disk with added mass near its edges, confirming the logic behind Eq. 5.

Figure 7:
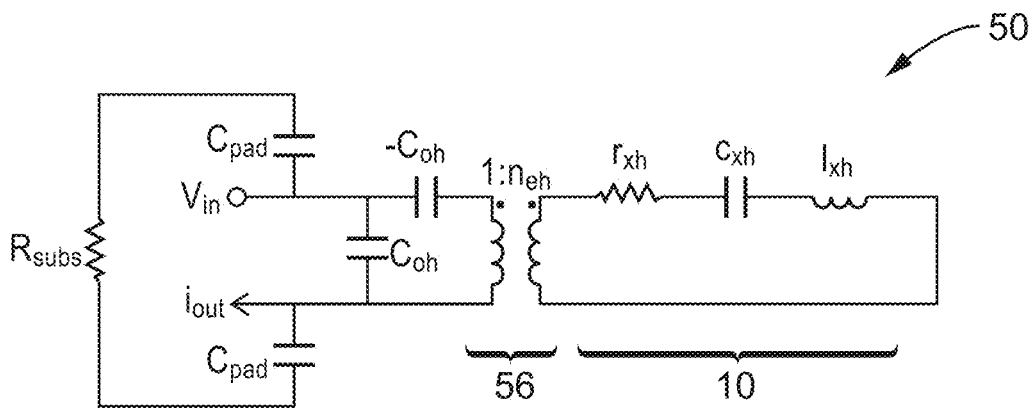
FIG. 7 is a schematic circuit diagram of a transformer-based equivalent circuit (including substrate parasitics) for a hollow disk resonator in a one-port drive and sense scheme.
Figure 8:
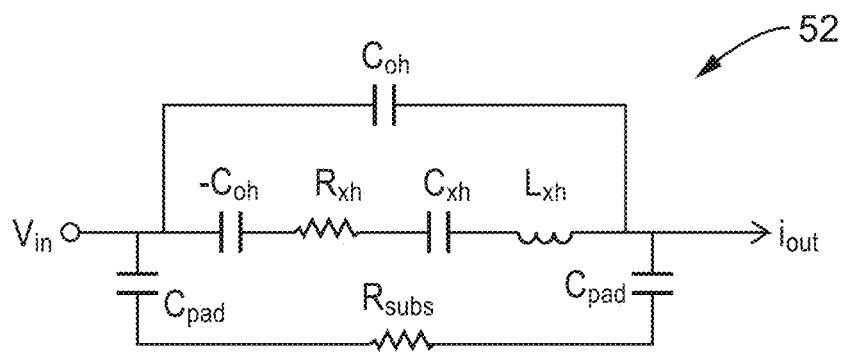
FIG. 8 is a schematic circuit diagram of an impedance-explicit equivalent circuit (including substrate parasitics) for a hollow disk resonator in a one-port drive and sense scheme.

FIG. 7 and FIG. 8 show schematic circuit diagrams of a transformer-based equivalent circuit 50 and an impedance-explicit equivalent circuit 52 respectively (including substrate parasitics) for a hollow disk resonator 10 in a one-port drive and sense scheme. In FIG. 7, 56 is the electromechanical interface, $C_{oh}$ is the overlap capacitance, $-C_{oh}$ is the spring softening, $C_{pad}$ is the bond pad capacitance, and $R_{subs}$ is the substrate resistance.

Referring to the circuit schematic diagrams of FIG. 7 and FIG. 8, the hollow disk motional capacitance $C_{xh}$ takes the form:

$$C_{xh} = eta_{Eh}^2 c_{xh} = \frac{\eta_{eh}^2}{k_{mh}} = \frac{V_P^2}{d_o^4} \frac{4\varepsilon_o^2 R^2 (H+h)^2}{\pi \chi K_{mat}^2 Eh} \left\{ 1 + \frac{2}{\chi} \frac{t}{R} \frac{H}{h} \right\} \quad \text{Eq. 9}$$

where $\eta_{eh}$ and $k_{mh}$ are hollow disk electromechanical turns ratio and effective mechanical stiffness, respectively.

Using Eq. 9 in conjunction with the other equivalent circuit parameters summarized in FIG. 7 and FIG. 8 yields the following expression for the electromechanical coupling factor as gauged by $C_{xh}/C_{oh}$:

$$\frac{C_{xh}}{C_{oh}} = \left\{ \frac{V_P^2}{d_0^3} \frac{2\varepsilon_o R}{\pi^2 \chi K_{mat}^2 E} \right\} \left\{ 1 + \frac{H}{h} \right\} \left\{ 1 + \frac{2}{\chi} \frac{t}{R} \frac{H}{h} \right\} \quad \text{Eq. 10}$$

Figure 9:
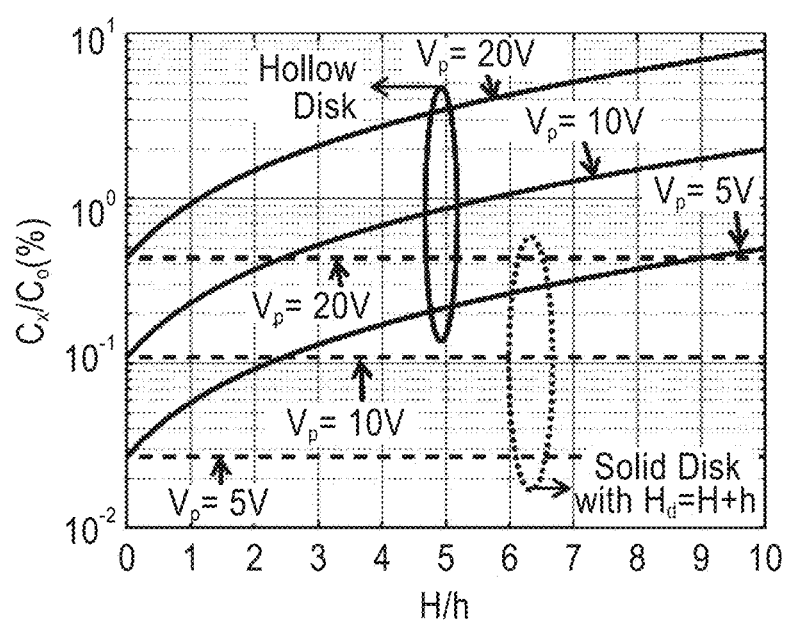
FIG. 9 is a plot showing a comparison of conventional and hollow disk electromechanical coupling as gauged by $C_x/C_o$ for varying values of H/h at different dc-bias voltages.
Figure 10:
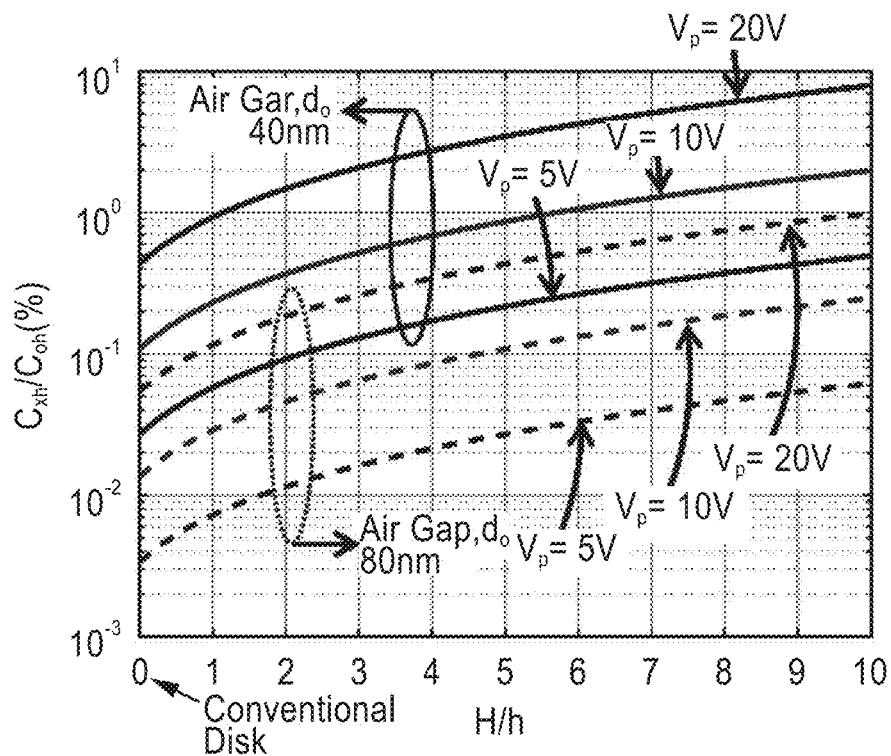
FIG. 10 is a plot showing hollow disk electromechanical coupling as gauged by $C_x/C_o$ for varying values of H/h at different dc-bias voltages and with two different gap spacings.

The first term in Eq. 10 is the $C_x/C_o$ for a solid disk resonator, i.e., H=0. The next two terms are always greater than 1, so this provides a path towards larger electromechanical coupling via hollowing. In particular, the second term is linearly proportional to the ratio of H to the disk thickness h and offers a very convenient design knob. To better elucidate this, FIG. 9 compares plots of $C_x/C_o$ vs. H/h for 20-μm-radius solid and hollow disks using Eq. 10, with $V_P$'s of 5V, 10V, and 20V. FIG. 10 shows similar plots for the hollow disk resonator for two different gap spacings, i.e., 40 nm and 80 nm. The design parameters for both plots are: R=20 μm, t=500 nm, E=158 GPa, ρ=2300 kg/m³, $K_{mat}$=0.654, and χ=0.763. With typical values of H=2.5 μm and h=0.5 μm, the hollow disk design boosts $C_x/C_o$ by 8 times over a conventional solid disk. An even more aggressive design with H/h=10 achieves almost 18 times improvement in $C_x/C_o$ over its conventional counterpart.

Figure 11:
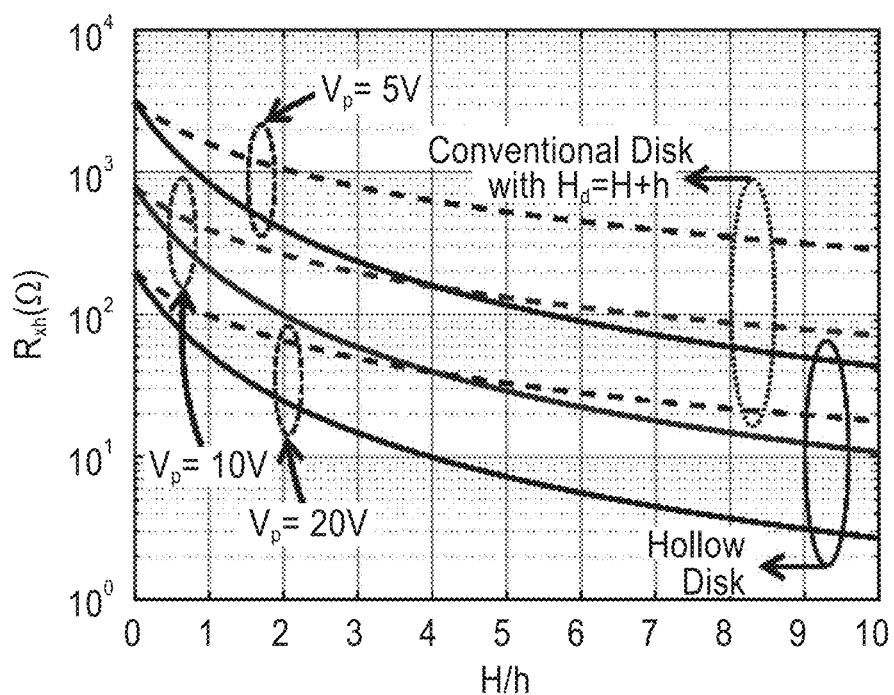
FIG. 11 is a plot showing a comparison of conventional and hollow disk motional resistance for varying values of H/h at different dc-bias voltages.

Motional resistance Rx also benefits from hollowing out the disk structure as reduced mass leads to less mechanical damping, and hence less Rx for a given electromechanical turns ratio $\eta_{eh}$. Expressing hollow disk motional resistance in terms of the design parameters given in FIG. 7 and FIG. 8 yields:

$$R_{xh} = \frac{r_{xh}}{\eta_{eh}^2} = \frac{\chi K_{mat} \sqrt{E\rho} \, d_o^4 h}{4Q\pi^2 V_P^2 \varepsilon_o^2 R(H+h)^2} \left\{ 1 + \frac{2}{\chi} \frac{t}{R} \frac{H}{h} \right\} \quad \text{Eq. 11}$$

where $r_{xh}$ is mechanical damping and Q is quality factor. FIG. 11 compares motional resistances achieved by a hollow disk and conventional solid design with a thickness $H_d$=H+h at different dc-bias voltages for varying H/h ratios. The design parameters for FIG. 11 are: R=20 μm, $d_o$=40 nm, Q=10,000, h=0.5 μm, t=500 nm, E=158 GPa, ρ=2300 kg/m³, $K_{mat}$=0.654, and χ=0.763. For a typical value of h=0.5 μm, the hollow disk design achieves 4.5 and 6.6 times smaller motional resistance than its conventional counterpart with $H_d$=3 μm and $H_d$=5.5 μm, respectively.

2. Fabrication

FIG. 12A through FIG. 12H show schematic cross-sectional side views of a fabrication process flow for the asymmetric hollow disk resonator 10 of FIG. 2 and FIG. 3. In a preferred embodiment, the hollow disk cross-section in FIG. 3 utilizes a similar sequence of surface-micromachining depositions as used in a conventional disk process, but with different thicknesses and etch ordering.

Figure 12A:
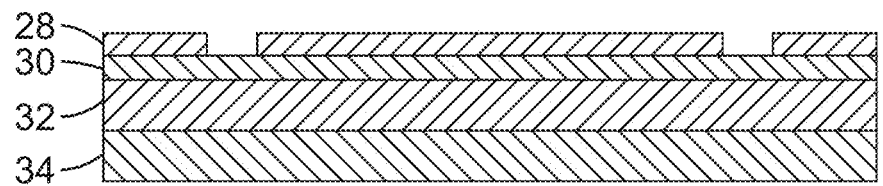
FIG. 12A shows a schematic cross-sectional side view for the interconnect layer etch step of a fabrication process flow for the asymmetric hollow disk resonator of FIG. 2 and FIG. 3.

Referring to FIG. 12A, the fabrication process starts with successive depositions of 2 μm-thick low temperature oxide (LTO) (layer 32) at 450° C. and 500 nm-thick low stress nitride layer 30 at 835° C., both via low-pressure chemical vapor deposition (LPCVD), to serve as isolation layers over a lightly doped p-type silicon starting wafer 34. LPCVD polycrystalline silicon then follows at 590° C. for 8 hours to achieve a 3-μm-thick interconnect layer film 28, subsequently doped in a POCl₃ furnace for 1 hour at 1050° C. After patterning photoresist with a first mask, deep reactive ion etching (DRIE) using an SF₆ chemistry delineates the interconnect layer 28 as depicted in FIG. 12A. Planarization then follows via deposition of 4 μm-thick phospho-silicate glass (PSG), re-flow of PSG at 950° C. for 30 min, and chemical mechanical polishing (CMP) down to the polysilicon to leave a flat surface that facilitates subsequent processing.

Figure 12B:
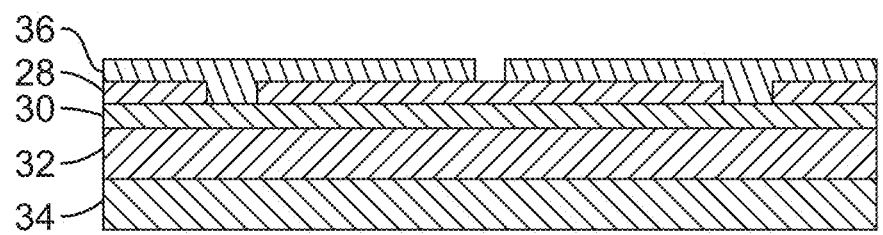
FIG. 12B shows a schematic cross-sectional side view for the sacrificial spacer etch step of the fabrication process flow for the asymmetric hollow disk resonator of FIG. 2 and FIG. 3.

Referring now to FIG. 12B, hollow device fabrication then begins with a 500 nm PSG deposition at 450° C. to serve as a bottom sacrificial spacer 36 between the structural and interconnect layer 28, as well as an additional dopant source to further reduce the sheet resistance of the interconnect traces. Next, lithography through a second mask delineates the stem hole and reactive ion etching (RIE) using an Ar:CHF₃:CF₄ chemistry opens the hole in layer 36, as shown in FIG. 12B.

Figure 12C:
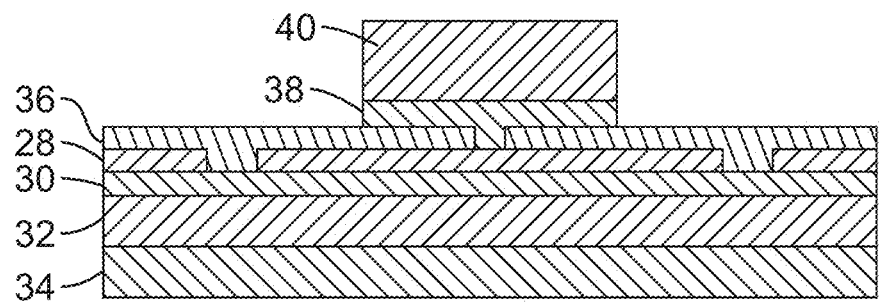
FIG. 12C shows a schematic cross-sectional side view for the planar structural etch step of the fabrication process flow for the asymmetric hollow disk resonator of FIG. 2 and FIG. 3.

Referring now to FIG. 12C, the hollow disk fabrication deviates from the conventional solid disk process flow. Instead of depositing a thick layer of structural polysilicon, e.g. 3 μm, the process of the present description uses a much thinner 500 nm-thick LPCVD polysilicon structural layer 38 at 590° C., followed by a 2.5 μm-thick PSG deposition layer 40 at 450° C. This polysilicon serves as material for the bottom disk structure while also filling the stem hole to form the stem 14. Lithography then delineates the disk edges and RIE using an Ar:CHF₃:CF₄ chemistry cuts through the oxide to form a mold to define the eventual hollow disk structure. The oxide also serves as a hard mask for the subsequent structural polysilicon etch, which uses a Lam TCP 9400SE polysilicon RIE etch recipe with gas flow rates of 140 sccm of HBr, 14 sccm of Cl₂, and 5 sccm of O₂ at 12 mTorr pressure with 250 W and 75 W RF and wafer bias powers, respectively. At this point, the cross section is as in shown in FIG. 12C.

Figure 12D:
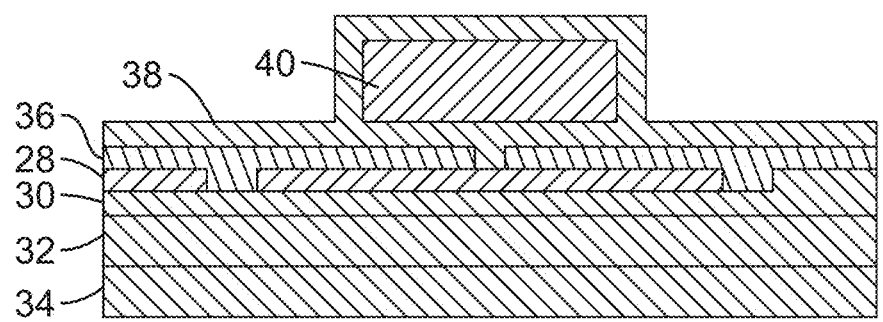
FIG. 12D shows a schematic cross-sectional side view for the sidewall structural layer deposition step of the fabrication process flow for the asymmetric hollow disk resonator of FIG. 2 and FIG. 3.
Figure 12E:
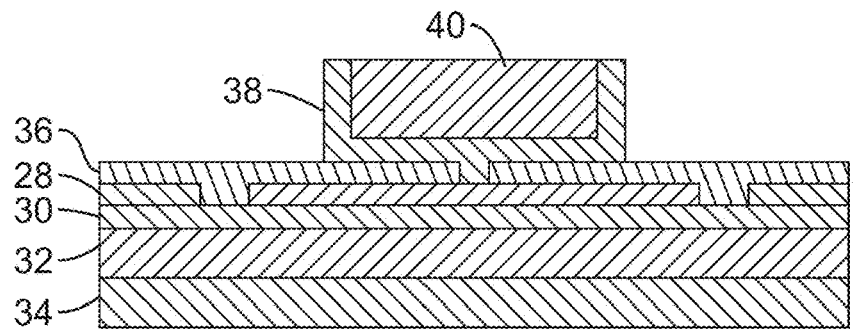
FIG. 12E shows a schematic cross-sectional side view for the sidewall structural layer etch step of the fabrication process flow for the asymmetric hollow disk resonator of FIG. 2 and FIG. 3.

Referring now to FIG. 12D and FIG. 12E, conformal deposition of 500 nm LPCVD polysilicon at 590° C. and blanket etching are shown respectively to form the sidewall structural layer 38. The forming of layer 38 around and over the sacrificial deposition layer 40 forms a molded polysilicon side wall. LPCVD of high temperature oxide (HTO) at 920° C. using 40 sccm of DCS and 100 sccm of N₂O flow with 600 mTorr process pressure deposits the sidewall sacrificial oxide that defines the eventual 37 nm electrode-to-resonator gap.

Figure 12F:
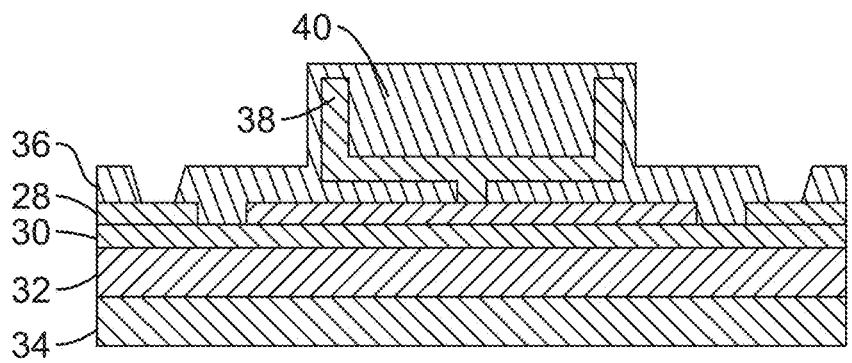
FIG. 12F shows a schematic cross-sectional side view for the gap spacer deposition and anchor etch step of the fabrication process flow for the asymmetric hollow disk resonator of FIG. 2 and FIG. 3.

Lithography followed by an Ar:CHF₃:CF₄ RIE etches electrode anchor openings to yield the cross-section of FIG. 12F.

Figure 12G:
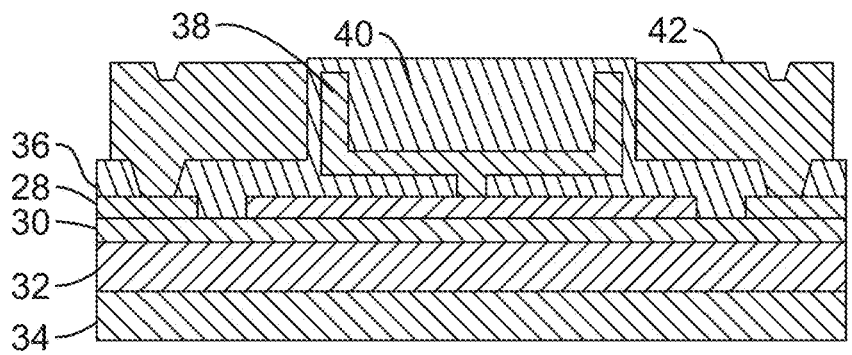
FIG. 12G shows a schematic cross-sectional side view for the electrode layer patterning step of the fabrication process flow for the asymmetric hollow disk resonator of FIG. 2 and FIG. 3.
Figure 12H:
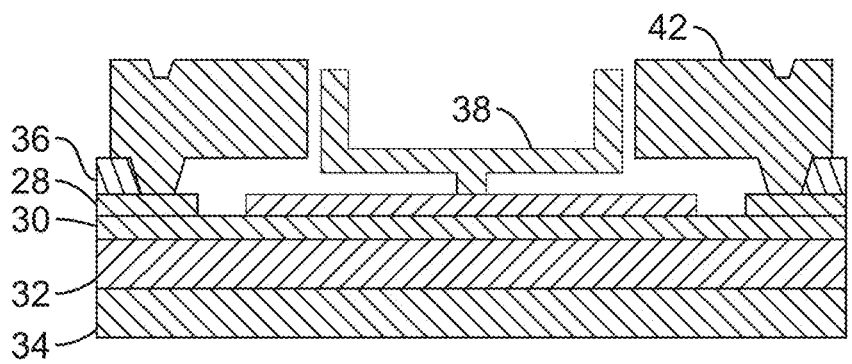
FIG. 12H shows a schematic cross-sectional side view for the HF release step of the fabrication process flow for the asymmetric hollow disk resonator of FIG. 2 and FIG. 3.
Figure 13A:
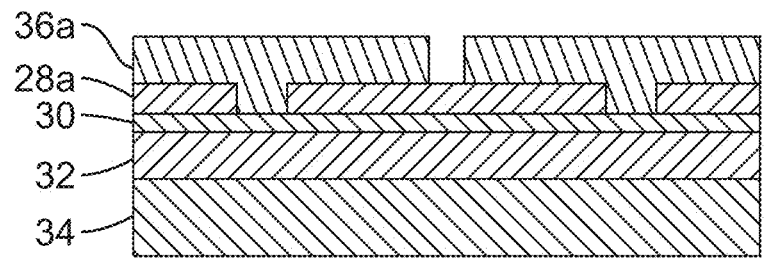
FIG. 13A through FIG. 13F show schematic cross-sectional side views of a fabrication process flow for the symmetric hollow disk resonator of FIG. 4.
Figure 13B:
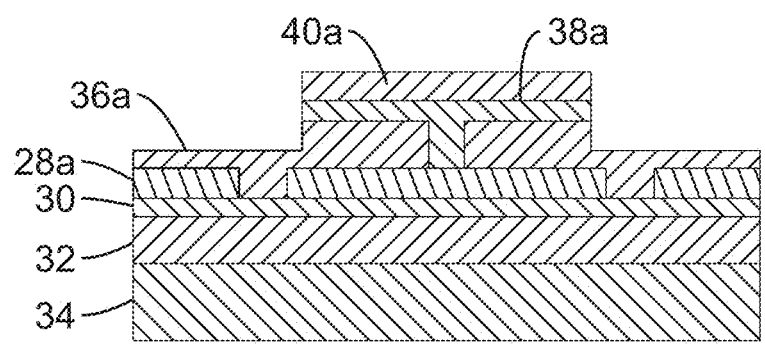
Figure 13C:
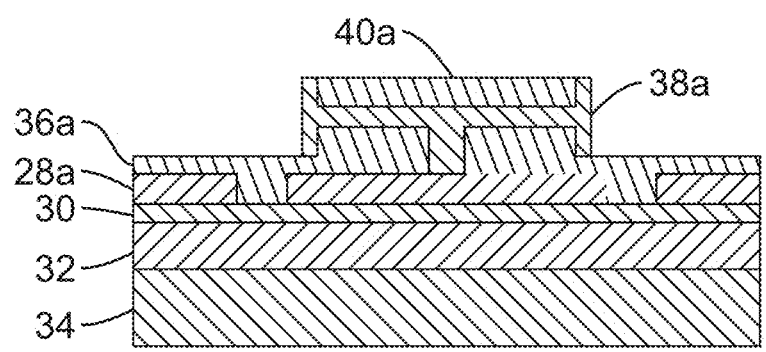
Figure 13D:
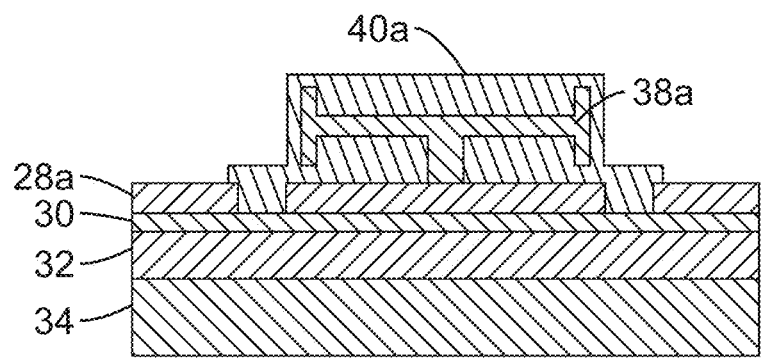
Figure 13E:
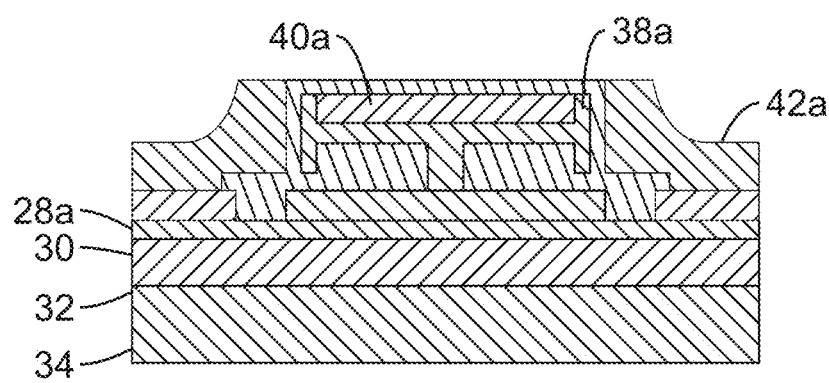
Figure 13F:
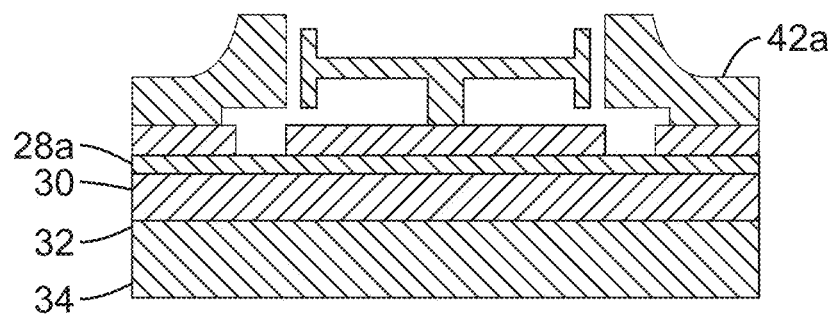

After a blanket LPCVD deposition of 3 µm-thick polysilicon for 8 hours and $POCL_3$ doping for 1 hour at 590° C. and 1050° C., respectively, the final lithography and DRIE using an $SF_6$ chemistry define the electrodes in layer 42 and yield the cross-section in FIG. 12G which is ready for release. The release process employs 49% liquid HF to free the disk structure and achieve the final cross-section of FIG. 12H.

Table 1 shows detailed steps for an exemplary fabrication process for an asymmetric hollow disk according to the fabrication process depicted in FIG. 12A through FIG. 12H.

FIG. 13A through FIG. 13F show schematic cross-sectional side views of a fabrication process flow for the symmetric hollow disk resonator 10A of FIG. 4, illustrating interconnect layer film 28a, bottom sacrificial spacer 36a polysilicon structural layer 38a, PSG deposition layer 40a, and electrode layer 42a on top of the substrate layers 30, 32 and 34.

Table 2 shows detailed steps for an exemplary fabrication process for a symmetric hollow disk according to the fabrication process depicted in FIG. 13A through FIG. 13F. The process flow steps for the symmetric hollow disk resonator 10A (FIG. 13A-FIG. 13F and Table 2) are largely similar to the process flow steps for the asymmetric hollow disk resonator 10 (FIG. 12A-FIG. 12H and Table 1), with the exception that the process flow for the symmetric hollow disk resonator 10A includes an extra step of timed etch (i.e., step b-3 in Table 2). Since industrial applications usually avoid timed etch because of difficulties in controlling the uniformity of the etch rate throughout the wafer and from wafer to wafer, an optimized alternative process may add a thin layer as etch stop in the thick silicon dioxide.

Figure 14:
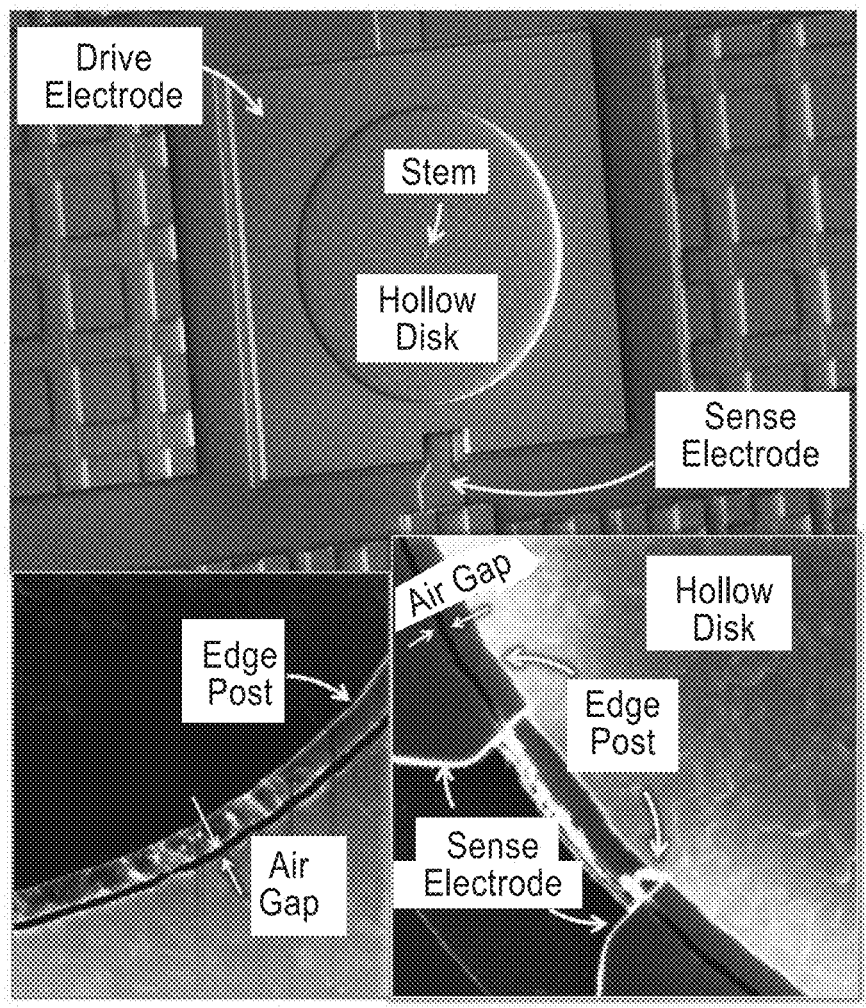
FIG. 14 shows images of wide-view and zoom-in SEM's of a fabricated polysilicon hollow disk resonator.

FIG. 14 shows an SEM image of a fabricated and released hollow disk resonator in accordance with the asymmetric hollow disk resonator 10 of FIG. 2 and FIG. 3, with expanded views of the edge ring, gap, and overlapping I/O electrodes. Tables 3 and 4 summarize asymmetric hollow-disk performance under various operating conditions, e.g., voltages.

Table 5 provides a comparison summary of detail design and equivalent circuit variables of an exemplary 80 MHz asymmetric hollow disk and a 80 MHz solid disk, including geometric dimensions of the structure (e.g., R, H, h, t, and $d_o$) and variables from test results (e.g., $V_P$, Q, $f_{nom}$, and $f_o$). In this exemplary configuration, the mechanical inductance ($l_x$) of the hollow disk is only 38% of the solid disk. The electromechanical coupling ratio ($\eta_e$) of the hollow disk is 66% higher than the solid one. As a result, the motional-to-static capacitive ratio $C_x/C_e$ can be boosted by approximately 25 times and the motional resistance ($R_x$) is 7.5 times smaller.

Table 6 provides a comparison summary of detail design and equivalent circuit variables of an exemplary 128 MHz symmetric hollow disk and a 128 MHz solid disk, including geometric dimensions of the structure (e.g., R, H, h, t, and d) and variables from test results (e.g., $V_P$, Q, $f_{nom}$, and $f_o$). The dynamic mass of the hollow disk is only 27% of the original in the solid disk. As a result, the hollow disk can boost $C_x/C_o$ by approximately four times and lower the motional resistance ($R_x$) by 3.7 times.

Table 7 provides a comparison summary of detail design and equivalent circuit variables of an exemplary device with a large stem having a radius of 8 µm, including geometric dimensions of the structure (e.g., R, H, h, t, and $d_o$) and variables from test results (e.g., $V_P$, Q, $f_{nom}$, and $f_o$).

3. Measurement Results

A Lakeshore FWPX Vacuum Probe Station housing hollow disk resonators maintained a vacuum pressure of 50 µTorr during testing. Probes accessed the devices, delivering the excitation signal and sensing their output currents, which they directed to the 50Ω input terminal of a sense amplifier, then to the input of an Agilent E5071C vector network analyzer.

Figure 15A:
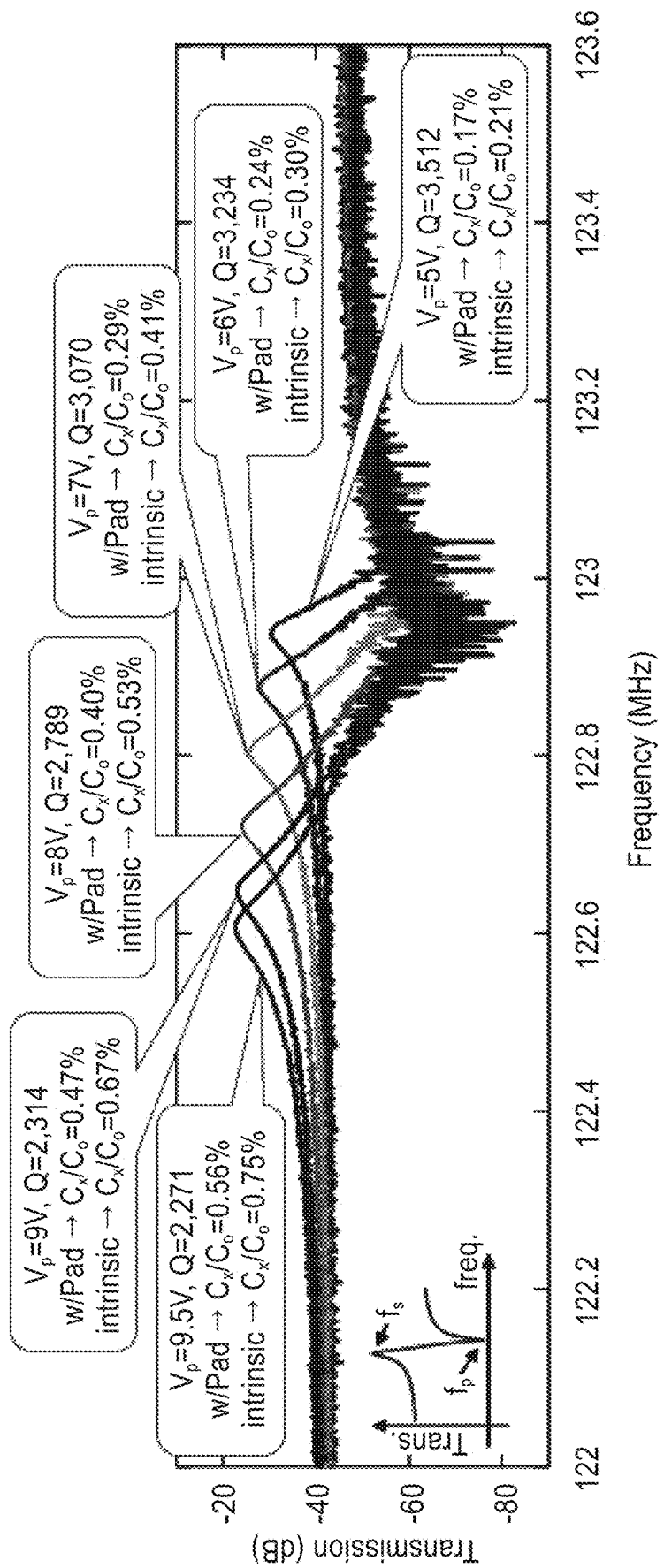
FIG. 15A shows a plot of measured frequency response curves for a 123-MHz hollow disk resonator as a function of dc bias voltage along with $C_x/C_o$ values.
Figure 15B:
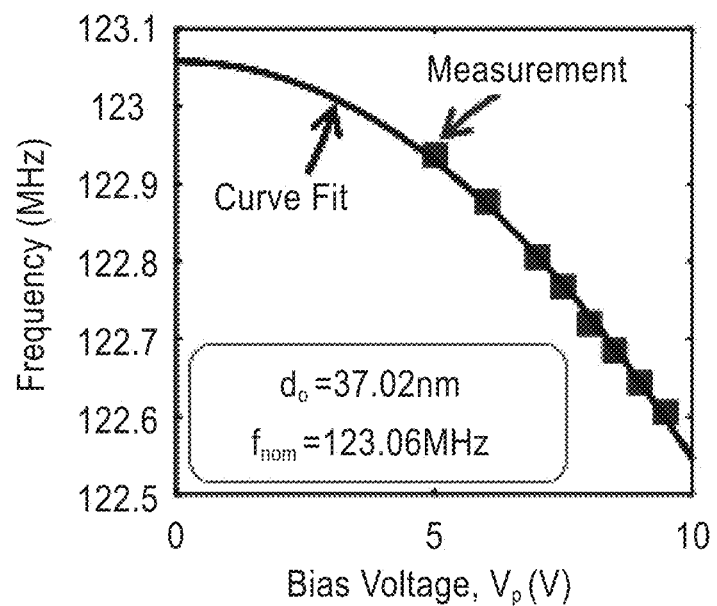
FIG. 15B is a plot of resonance frequency $f_o$ plotted against dc-bias voltage $V_P$.

FIG. 15A presents measured frequency response curves for a 123-MHz hollow disk resonator at various dc-bias voltages $V_P$ under 50 µTorr vacuum with R=20 µm, H=2.5 µm, h=0.5 µm, t=500 nm, and stem radius $R_s$=1 µm. Here, as FIG. 15B depicts, a curve-fitting method using resonant frequency versus dc-bias voltage data of FIG. 15A accurately extracts the electrode-to-edge ring gap $d_o$ and nominal resonant frequency $f_{nom}$ as 37.02 nm and 123.06 MHz, respectively.

a. Electromechanical Coupling Strength, $C_x/C_o$

One approach to measuring electromechanical coupling strength $C_x/C_o$ employs parallel and series resonance frequencies, $f_p$ and $f_s$ as indicated in FIG. 15A respectively. Ignoring (for now) the parasitic bond pad capacitances $C_{pad}$ in FIG. 8 and solving for the input impedance yields:

$$f_s = \frac{1}{2\pi\sqrt{L_x(C_x//-C_o)}}, f_p = \frac{1}{2\pi\sqrt{L_xC_x}} \qquad \text{Eq. 12}$$

Here, the parallel resonance occurs at the nominal resonance frequency $f_{nom}$ and electrical stiffness pulls the series resonant frequency down, separating the two frequencies. Rearranging the expressions in Eq. 12 and isolating $C_x/C_o$ yields:

$$\frac{C_x}{C_o} = 1 - \left(\frac{f_s}{f_p}\right)^2. \qquad \text{Eq. 13}$$

Using Eq. 13 directly on the data, $C_x/C_o$ values rise from 0.17% at $V_P$=5V to 0.56% at $V_P$=9.5V, the latter of which is 5 times larger than the 0.11% expected for a 3-µm-thick conventional solid radial-contour mode disk with the same gaps and bias voltage. The benefits to filter performance are clear from FIG. 1.

As previously mentioned, however, Eq. 13 yields the intrinsic device $C_x/C_o$ only if parasitic capacitances are negligible compared with the overlap shunt capacitance $C_o$. In other words, it works well only when the device feedthrough capacitance is large, which is the case for most piezoelectric resonators. Capacitive-gap transducers generally have much smaller $C_o$ than piezoelectric ones, which can be problematic when the MEMS-to-transistor interface has large shunt capacitance, but for small interface capacitance permits substantially lower power operation.

Given that the present hollow disk device is capacitive-gap transduced, the bond pads shown in FIG. 8 incur parasitic capacitances $C_{pad}$ comparable with the device's overlap shunt capacitance $C_o$. For example, a 60 µm×60 µm bond pad alone has 54.9 fF of shunt capacitance $C_{pad}$ through the 500 nm nitride 30 and 2 µm oxide 32 layers, while the overlap capacitance $C_o$ for the device measured in FIG. 15A is 90.2 fF. In this case, use of Eq. 13 yields not the intrinsic $C_x/C_o$ of the device in question, but rather the $C_{pad}$-loaded value (which of course is a useful quantity in itself).

To extract out the intrinsic $C_x/C_o$, one can re-derive it, but this time considering the bond pad capacitors in FIG. 8 and noting that the substrate resistance $R_{subs}$ connecting them has comparably negligible impedance at the frequency of operation, i.e., 123 MHz. Doing so, the expressions for the parasitic-encumbered parallel and series resonance frequencies become:

$$f'_s = \frac{1}{2\pi\sqrt{L_x(C_x//-C_o)}} \quad \text{Eq. 14}$$

$$f'_p = \frac{1}{2\pi\sqrt{L_xC_x\frac{2C_o+C_{pad}}{2C_o+C_{pad}(1-C_x/C_o)}}} \quad \text{Eq. 15}$$

With the inclusion of parasitics, the parallel resonance dip slightly shifts to the left, whereas the series resonant frequency behaves as for the case without parasitics. Rearranging Eq. 14 and Eq. 15 and expressing $C_x/C_o$ in terms of the parasitic-encumbered parallel and series resonance frequencies, $f_p'$ and $f_s'$, yields:

$$\frac{C_x}{C_o} = \alpha\frac{2C_o+C_{pad}}{2C_o+\alpha C_{pad}} \text{ where } \alpha = 1-\left(\frac{f'_s}{f'_p}\right)^2. \quad \text{Eq. 16}$$

Using Eq. 16 with $C_{pad}$=54.9 fF, $C_o$=90.2 fF, and $V_P$=9.5V curve in FIG. 15A produces an intrinsic $C_x/C_o$ value of 0.72%, which is substantially better than 0.56% obtained via Eq. 13.

Although Eq. 16 provides invaluable insight into the effect of parasitics on electromechanical coupling strength, accurately calculating $C_{pad}$ is not a straightforward task. A more direct method to extract $C_x/C_o$ would be better.

Interestingly, the expressions for series resonance frequency in Eq. 12 and Eq. 15 are identical. This suggests that series resonance frequency is impervious to bond pad parasitics, hence might be a better starting point to determine $C_x/C_o$. As depicted in FIG. 15B, this frequency $f_o$ is a strong function of dc-bias voltage $V_P$, mainly due to electrical stiffness, which influences it according to:

$$f_o = f_{nom}\sqrt{1-\frac{k_e}{k_m}} = f_{nom}\sqrt{1-\frac{C_x}{C_o}} \quad \text{Eq. 17}$$

where $f_{nom}$ is nominal (i.e., zero bias) resonance frequency, $k_e$ and $k_m$ are the electrical and mechanical stiffnesses, respectively.

The terms $k_e$ and $k_m$ take the form:

$$k_e = \frac{\eta_e^2}{C_o}, k_m = \frac{\eta_e^2}{C_x} \quad \text{Eq. 18}$$

Manipulation of Eq. 18 shows that $(k_e/k_m)=(C_x/C_o)$. Rearrangement of Eq. 17 yields an alternate $C_x/C_o$ expression:

$$\frac{C_x}{C_o} = 1-\left(\frac{f_o}{f_{nom}}\right)^2 \quad \text{Eq. 19}$$

Eq. 19 which now provides the intrinsic device electromechanical coupling strength even in the presence of bond pad (or other) parasitics. Note that the curve-fitting method used to extract the electrode-to-edge ring gap $d_o$ in FIG. 15B also extracts $f_{nom}$.

Now using Eq. 19, $C_x/C_o$ values rise from 0.21% at $V_P$=5V to 0.75% at $V_P$=9.5V, the latter of which is almost 7 times larger than the 0.11% for a conventional solid radial-contour mode disk with the same gaps.

b. Quality Factor, Q

Figure 15C:
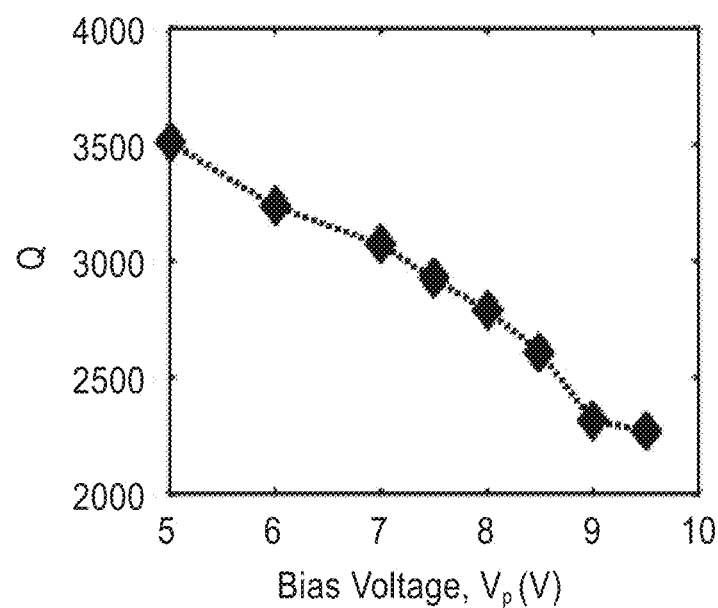
FIG. 15C is a plot of quality factor measurement for varying dc-bias voltages $V_P$.

FIG. 15C plots quality factor Q at various dc-bias voltages. The measured Q of 2,271 at $V_P$=9.5V is well short of the >10,000 often seen for capacitive-gap transduced polysilicon devices. High film electrical resistance could be one cause of this. The problem could also stem from larger surface loss mechanisms, given the higher surface-to-volume ratio of this device.

Figure 16:
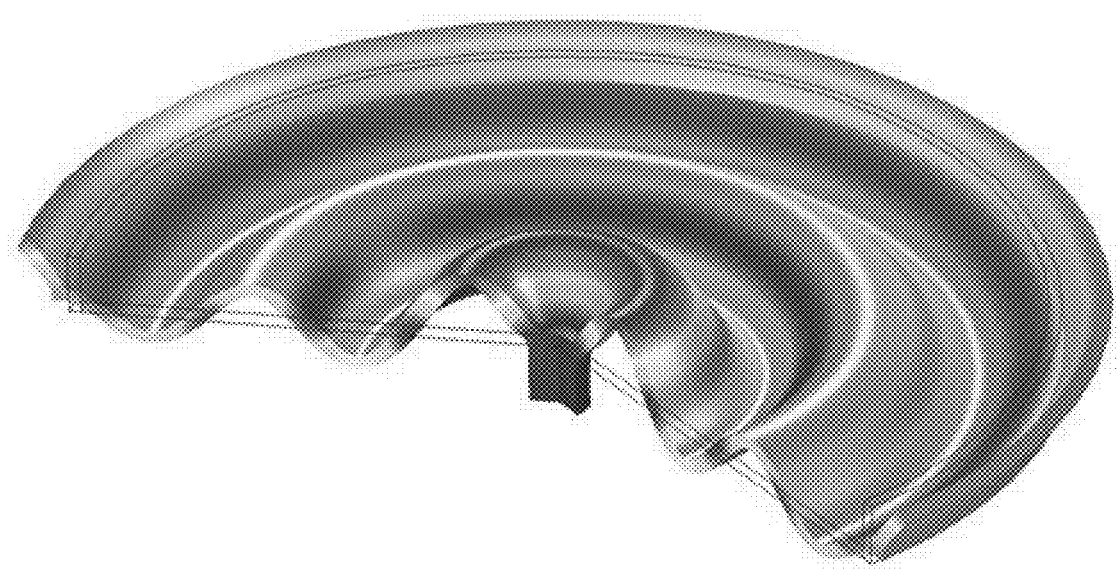
FIG. 16 is an image of the finite-element simulated mode shape for the hollow disk resonator, but without vertical motion constraints. The simulation clearly shows transverse (vertical) displacements that likely radiate energy into the stem anchor and subsequently to the substrate.

On the other hand, anchor loss is another likely reason for lower than expected Q. In particular, lifting the vertical constraint of the finite-element mode shape simulations of FIG. 6A and FIG. 6B yields that in FIG. 16, which clearly shows transverse (vertical) displacements that likely radiate energy into the stem anchor and subsequently to the substrate. A more symmetric design, with edge rings both above and below the thin disk structure as shown in FIG. 4 or FIG. 5, is one solution to this problem.

Figure 15D:
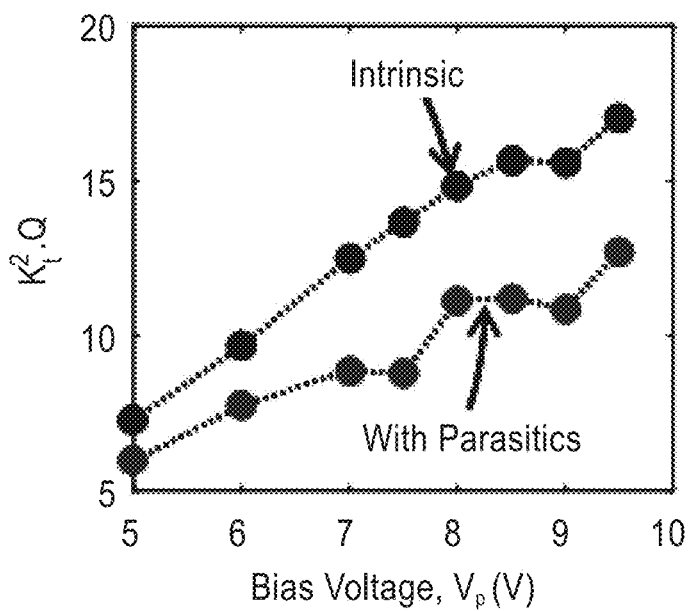
FIG. 15D is a pot of electromechanical coupling strength $C_x/C_o$ (or $k_t^2$) times quality factor figure of merit (FOM) plotted against dc-bias voltage $V_P$ with and without parasitics.

Even with these Q issues, the $k_t^2$-Q value of 17 as plotted in FIG. 15D for the resonator of FIG. 2 and FIG. 3 is significant compared with some of the best piezoelectric alternatives.

In sum, the hollowing-based increase in $C_x/C_o$ to 0.75% at 123 MHz is impressive, given that it does not require gap scaling. When combined with gap scaling, some very large $C_x/C_o$ values may be achieved. Combined with the Q's in the 3,000 range (and possibly over 50,000, which is more common for these types of resonators), such $C_x/C_o$'s may enable both narrow- and wide-band front-end filters for communications and very low power, low-noise oscillators. The $C_x/C_o$ increases of the present technology improve the passbands of channel-select filters that may be implemented for low power wireless transceivers, as well as lowering the power of MEMS-based oscillators.

Reasonable expectation that the Q of hollow resonator devices will increase to a value more appropriate for capacitive-gap transduced resonators, e.g., 20,000 with a symmetric design, may allow 40-nm-gap $k_t^2$-Q values on the order of 150, which begins to approach the enormous value posted by 13-nm-gap devices.

Potential uses of hollow-disk resonators of the present description may include but are not limited to the following:

1. Filters for RF channel-selecting filters for a low-power wireless transceiver that can enable practical software-defined cognitive radio, wideband filters for 3G, 4G, 5G, and beyond.

2. Ultra-low phase noise oscillators for timing (clocking), radar, navigation, and communications (e.g. Global System for Mobile (GSM) communications), where the higher the $C_x/C_o$, the lower the oscillator power consumption, and the wider its application range, and preferably at sub-µW.

3. Gyroscopes, accelerometers, and inertial measurement units, that employ resonating elements, such as MEMS-based gyroscopes used in automobiles, cell phones, and gaming wands, e.g., the Wii.

4. Sensors that employ resonating elements, including inertial measurement units, but also sensors for gas, temperature, pressure, motion, stress, and just about everything that would need to be sensed. (Resonant sensors are widely recognized as the most sensitive around).

5. High Q, high $C_x/C_o$ tank circuits used not only in communications but a myriad of other integrated circuits. High Q and $C_x/C_o$ benefit virtually all integrated circuit applications.

6. Energy scavenging devices, where $C_x/C_o$ often governs the overall efficiency and capability of the energy scavenger.

From the description herein, it will be appreciated that the present disclosure encompasses multiple embodiments which include, but are not limited to, the following:

1. A capacitive-gap transduced micromechanical resonator, comprising: a resonator structure; a first electrode disposed adjacent the resonator structure at a spaced-apart distance defined by an air gap; and a second electrode in proximity to the resonator structure; wherein the resonator structure comprises a hollowed cavity that reduces the dynamic mass and stiffness to increase electromechanical coupling of the resonator.

2. The apparatus or method of any preceding or subsequent embodiment, wherein the first terminal comprises a drive electrode and the second terminal comprises a sense electrode.

3. The apparatus or method of any preceding or subsequent embodiment: wherein the resonator structure comprises a circular disk; and wherein the hollowed cavity forms a thin bottom disk having a radius R and a high-aspect-ratio circular edge ring of width of t.

4. The apparatus or method of any preceding or subsequent embodiment, wherein the resonator structure is configured to operate in radial-contour mode, whispering gallery mode, or wine-glass mode.

5. The apparatus or method of any preceding or subsequent embodiment wherein the bottom disk provides stiffness and the edge ring increases electrode-to-resonator overlap area while minimizing mass to maximize electromechanical coupling.

6. The apparatus or method of any preceding or subsequent embodiment, wherein the disk is coupled to an interconnect layer via a centrally located stem.

7. The apparatus or method of any preceding or subsequent embodiment, wherein the stem is hollow.

8. The apparatus or method f any preceding or subsequent embodiment wherein one or more surfaces of the disk comprise a molded structure.

9. The apparatus or method of any preceding or subsequent embodiment, wherein the resonator is fabricated according to steps comprising: (a) patterning the interconnect layer; (b) planarizing a surface of the interconnect layer with a polished sacrificial layer and etching a hole in the sacrificial layer for the stem; (c) depositing and patterning a structural layer for the disk, (d) conformally depositing a sidewall to the structural layer; (e) etching the structural layer to define an edge-ring to hollow the disk; (f) depositing a sidewall sacrificial layer and etching anchor openings for the drive electrode; (g) depositing and patterning an electrode layer; and (h) releasing the electrode layer, structural layer, and interconnect layer from the sacrificial layer.

10. The apparatus or method of any preceding or subsequent embodiment, wherein conformally depositing the sidewall comprises molding the sidewall over a sacrificial layer.

11. The apparatus or method of any preceding or subsequent embodiment wherein the resonator is fabricated according to the additional step of etching a bottom portion of the structural layer to form a symmetric hollow disk by protruding the edge ring upward and downward.

12. The apparatus or method of any preceding or subsequent embodiment, wherein the resonator structure is symmetric in at least two dimensions.

13. The apparatus or method of any preceding or subsequent embodiment, wherein the resonator has an electromechanical coupling strength ($C_x/C_o$) of 0.75% at 123 MHz with 40-nm air gap.

14. The apparatus or method of any preceding or subsequent embodiment, wherein the resonator forms a sub-µW low-phase noise reference oscillator.

15. The apparatus or method of any preceding or subsequent embodiment, wherein the resonator forms high-frequency clocking or radar oscillator.

16. The apparatus or method of any preceding or subsequent embodiment, wherein the resonator forms a filter for a low-power wireless transceiver.

17. The apparatus or method of any preceding or subsequent embodiment, wherein the wireless transceiver operates at very high frequency (VHF) and ultra-high frequency (UHF).

18. A capacitive-gap transduced resonator, comprising: a resonator disk; a first terminal disposed adjacent the disk at a spaced-apart distance defined by an air gap; and a second terminal in proximity to the disk; wherein the disk comprises a hollowed cavity that reduces the dynamic mass and stiffness to increase electromechanical coupling of the resonator; wherein the hollowed cavity forms a thin bottom disk having a radius R and a high-aspect-ratio circular edge ring of width of t.

19. The apparatus or method of any preceding or subsequent embodiment, wherein the second terminal comprises a drive electrode and the first terminal comprises a sense electrode.

20. The apparatus or method of any preceding or subsequent embodiment, wherein the resonator disk is configured to operate in radial-contour mode, whispering gallery mode, or wine-glass mode.

21. The apparatus or method of any preceding or subsequent embodiment, wherein the bottom disk provides stiffness and the edge ring increases electrode-to-resonator overlap area while minimizing mass to associated with the resonance frequency of the resonator, thereby maximizing electromechanical coupling.

22. The apparatus or method of any preceding or subsequent embodiment, wherein the disk is coupled to an interconnect layer via a centrally located stem.

23. The apparatus or method of any preceding or subsequent embodiment, wherein the stem is hollow.

24. The apparatus or method of any preceding or subsequent embodiment, wherein the edge ring comprises a molded polysilicon structure.

25. The apparatus or method of any preceding or subsequent embodiment, wherein the resonator is fabricated according to steps comprising: (a) patterning the interconnect layer; (b) planarizing a surface of the interconnect layer with CMP and etching a hole for the stem; (c) depositing and patterning a structural layer for the disk; (d) conformally depositing a sidewall to the structural layer; (e) etching the structural layer to define an edge-ring of the disk; (f) depositing a sidewall sacrificial layer and etching anchor openings for the drive electrode; (g) depositing and patterning an electrode layer; and (h) releasing the electrode layer, structural layer, and interconnect layer from the sacrificial layer.

26. The apparatus or method of any preceding or subsequent embodiment, wherein the resonator disk is symmetric in at least two dimensions.

27. The apparatus or method of any preceding or subsequent embodiment, wherein the resonator is fabricated according to the additional step of etching a bottom portion of the structural layer to form a symmetric hollow disk by protruding the edge ring upward and downward.

28. The apparatus or method of any preceding or subsequent embodiment, wherein the resonator has an electromechanical coupling strength ($C_x/C_o$) of 0.75% at 123 MHz with 40-nm air gap.

29. The apparatus or method of any preceding or subsequent embodiment, wherein the resonator forms a sub-μW low-phase noise reference oscillator.

30. The apparatus or method of any preceding or subsequent embodiment, wherein the resonator forms high-frequency clocking or radar oscillator.

31. The apparatus or method of any preceding or subsequent embodiment, wherein the resonator forms a filter for a low-power wireless transceiver.

32. The apparatus or method of any preceding or subsequent embodiment, wherein the wireless transceiver operates at very high frequency (VHF) and ultra-high frequency (UHF).

33. The apparatus or method of any preceding or subsequent embodiment, wherein the resonator disk comprises a plurality of cavities.

34. A hollowed out disk resonator operated in a largely radial mode, wine-glass mode, or whispering gallery mode.

35. A disk resonator having a hollow disk cross-section.

36. A hollow disk resonator, comprising: a thin bottom disk of radius R; and a high-aspect-ratio circular edge ring of width of t; wherein the bottom disk sets stiffness; and wherein the edge ring contributes to minimal additional mass while increasing the electrode-to-resonator overlap, lowering the resonance frequency, which takes the form $$f_o = \left\{ \frac{K_{mat}}{2R} \sqrt{\frac{E}{\rho}} \right\} \frac{1}{\sqrt{1 + \Delta m / m_m}}$$

where the term in the curly bracket is the resonance frequency of a radial-contour mode disk with a radius R, $K_{mat}$ is a parameter dependent upon material properties, E is the Young's modulus, ρ is the Poisson ratio, Δm is the additional mass loading from the edge ring, and mm is the equivalent disk mass referenced to the edge.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to 10°, such as less than or equal to 5°, less than or equal to ±4°, less than or equal to ±3°, less than or equal to 2°, less than or equal to 1°, less than or equal to 0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Detailed Fabrication Process For An Asymmetric Hollow Disk

| Figure | Step | Fabrication | Details | Tools |
|---|---|---|---|---|
| 12A | a-1 | Deposition | LPCVD 2 μm LTO | tyster 11 & 2 |
|  | a-2 | Deposition | LPCVD 500 nm LSN | tyster 9 |
|  | a-3 | Deposition | LPCVD 1 μm LTO | tyster 11 & 2 |
|  | a-4 (m1) | Patterning | RIE SiO$_2$ (by Mask #1, m1) | asml 300 &sts-oxide |
| 12B | b-1 | Deposition | LPCVD 1.5 μm Si (doped) | tyster 10 & 6 |
|  | b-2 | CMP | CMP Si (stopped on SiO$_2$) | cmp |
|  | b-3 | Deposition | LPCVD 300 nm LTO | tyster 12 & 3 |
|  | b-4 (m2) | Patterning | RIE SiO$_2$ (by Mask #2, m2) | asml 300 &sts-oxide |

TABLE 1-continued

Detailed Fabrication Process For An Asymmetric Hollow Disk

| Figure | Step | Fabrication | Details | Tools |
|---|---|---|---|---|
| 12C | c-1 | Deposition | LPCVD 600 nm Si (doped) | tyster 16 & 3 |
| | c-2 | Deposition | LPCVD 2 μm LTO | tyster 12 & 4 |
| | c-3 (m3) | Patterning | RIE $SiO_2$ and Si (by Mask #3, m3) | asml 300 &sts-oxide & sts2 |
| 12D | d-1 | Deposition | LPCVD 350 nm Si (doped) | tyster 16 & 3 |
| 12E | e-1 | Etching | Blank RIE Si (without a mask) | sts2 |
| 12F | f-1 | Deposition | LPCVD 148 nm HTO | tyster 17 |
| | f-2 (m4) | Patterning | RIE $SiO_2$ (by Mask #4, m4) | asml 300 &sts-oxide |
| 12G | g-1 | Deposition | LPCVD 3 μm Si (doped) | tyster 16 & 6 |
| | g-2 | CMP | CMP Si (stopped on $SiO_2$) | cmp |
| | g-3 (m5) | Patterning | RIE Si (by Mask #5, m5) | asml 300 & sts2 |
| 12H | f-1 | Release | HF Release | msink 18 |

TABLE 2

Detailed Fabrication Process For Symmetric Hollow Disk

| Figure | Step | Fabrication | Details | Tools |
|---|---|---|---|---|
| 13A | a-1 | Deposition | LPCVD 2 μm LTO | tyster 11 & 2 |
| | a-2 | Deposition | LPCVD 500 nm LSN | tyster 9 |
| | a-3 | Deposition | LPCVD 1 μm LTO | tyster 11 & 2 |
| | a-4 (m1) | Patterning | RIE $SiO_2$ (by Mask #1, m1) | asml 300 &sts-oxide |
| | a-5 | Deposition | LPCVD 1.5 μm Si (doped) | tyster 10 & 6 |
| | a-6 | CMP | CMP Si (stopped on $SiO_2$) | cmp |
| | a-7 | Deposition | LPCVD 1.5 μm LTO | tyster 12 & 3 |
| | a-8 (m2) | Patterning | RIE $SiO_2$ (by Mask #2, m2) | asml 300 &sts-oxide |
| 13B | b-1 | Deposition | LPCVD 500 nm Si (doped) | tyster 16 & 3 |
| | b-2 | Deposition | LPCVD 2.2 μm LTO | tyster 12 & 4 |
| | b-3 (m3) | Patterning | RIE $SiO_2$, Si and $SiO_2$ (timed etch) (by Mask #3, m3) | asml 300 &sts-oxide & sts2 |
| 13C | c-1 | Deposition | LPCVD 600 nm Si (doped) | tyster 16 & 3 |
| | c-2 | Etching | Blank RIE Si (without a mask) | sts2 |
| 13D | d-1 | Deposition | LPCVD 50 nm HTO | tyster 17 |
| | d-2 (m4) | Patterning | RIE $SiO_2$ (by Mask #4, m4) | asml 300 &sts-oxide |
| 13E | e-1 | Deposition | LPCVD 3 μm Si (doped) | tyster 16 & 6 |
| | e-2 | CMP | CMP Si (stopped on $SiO_2$) | cmp |
| | e-3 (m5) | Patterning | RIE Si (by Mask #5, m5) | asml 300 & sts2 |
| 13F | f-1 | Release | HF Release | msink 18 |

TABLE 3

Hollow Disk Performance Under Various DC-Bias Voltages

| $V_P$ (V) | $f_o$ (MHz) | $C_x/C_o$ (%) | Q | $k_t^2$-Q |
|---|---|---|---|---|
| 5 | 122.9365 | 0.21 | 3,512 | 7.3 |
| 6 | 122.8755 | 0.30 | 3,234 | 9.7 |
| 7 | 122.8055 | 0.41 | 3,070 | 12.5 |
| 7.5 | 122.7665 | 0.47 | 2,923 | 13.7 |
| 8 | 122.7205 | 0.53 | 2,789 | 14.8 |
| 8.5 | 122.6845 | 0.60 | 2,610 | 15.7 |
| 9 | 122.6435 | 0.67 | 2,314 | 15.6 |
| 9.5 | 122.6055 | 0.75 | 2,271 | 17.0 |

TABLE 4

Hollow Disk Performance Under Various H/h Values

| H/h (−) | $R_{xh}$ (Ω) | $L_{xh}$ (mH) | $C_{xh}$ (fF) | $C_{oh}$ (fF) | $C_{xh}/C_{oh}$ (%) |
|---|---|---|---|---|---|
| 0 | 27,825 | 74.21 | 0.02 | 15.02 | 0.12 |
| 1 | 7,180 | 19.77 | 0.07 | 30.04 | 0.25 |
| 2 | 3,288 | 9.33 | 0.17 | 45.06 | 0.37 |
| 3 | 1,902 | 5.55 | 0.30 | 60.08 | 0.49 |
| 4 | 1,250 | 3.75 | 0.46 | 75.10 | 0.62 |
| 5 | 891 | 2.74 | 0.67 | 90.12 | 0.74 |
| 6 | 670 | 2.11 | 0.91 | 105.14 | 0.87 |
| 7 | 525 | 1.69 | 1.19 | 120.16 | 0.99 |
| 8 | 424 | 1.40 | 1.51 | 135.19 | 1.11 |
| 9 | 351 | 1.18 | 1.86 | 150.21 | 1.24 |
| 10 | 296 | 1.02 | 2.25 | 165.23 | 1.36 |

TABLE 5

Summary Of Variables Of An Asymmetric Hollow Disk And A Solid Disk

| | Parameters | Solid Disk | Hollow Disk | Units |
|---|---|---|---|---|
| Design Variables | Disk Radius (outer), R | 32.35 | 32.35 | μm |
| | Total Height, H | 2.4 | 2.4 | μm |
| | Inner Disk Thickness, h | — | 600 | nm |
| | Sidewall Thickness, t | — | 350 | nm |
| | Electrode-to-Resonator Gap, $d_o$ | 148 | 148 | nm |
| | DC Bias Voltage, $V_P$ | 20 | 20 | V |
| | Quality Factor, Q | 5000 | 5000 | — |
| | Nominal Frequency, $f_{nom}$ | 81.637 | 79.601 | MHz |
| | Resonance Frequency, $f_o$ | 81.631 | 79.450 | MHz |
| Equivalent Circuit Variables | Mech. Inductance (mass), $l_x$ | 13.850 | 5.288 | pH |
| | Mech. Capacitance (1/stiffness), $c_x$ | 0.274 | 0.756 | μF |
| | Mech. Resistance (damping), $r_x$ | 1.421 | 0.529 | μΩ |
| | Static Overlap Capacitance, $C_o$ | 29.185 | 29.185 | fF |
| | Electromechanical Coupling Ratio, $\eta_e$ | 3.944 | 6.582 | μC/m |
| | Motional Inductance, $L_x$ | 0.890 | 0.122 | H |
| | Motional Capacitance, $C_x$ | 0.004 | 0.033 | fF |
| | Motional Resistance, $R_x$ | 91.348 | 12.210 | kΩ |
| | Electrical Stiffness Equiv. Cap., $-C_e$ | −29.185 | −9.412 | fF |
| | $C_x$-to-$C_e$ Capacitive Ratio, $C_x/C_e$ | 0.015 | 0.384 | % |
| | $C_x$-to-$C_o$ Capacitive Ratio, $C_x/C_o$ | 0.015 | 0.142 | % |

TABLE 6

Summary Of Variables Of An Asymmetric Hollow Disk And A Solid Disk

| | Parameters | Solid Disk | Hollow Disk | Units |
|---|---|---|---|---|
| Design Variables | Disk Radius (outer), R | 20.6 | 20.6 | μm |
| | Total Height, H | 2.4 | 2.4 | μm |
| | Inner Disk Thickness, h | — | 500 | nm |
| | Sidewall Thickness, t | — | 600 | nm |
| | Electrode-to-Resonator Gap, $d_o$ | 50 | 50 | nm |
| | DC Bias Voltage, $V_P$ | 10 | 10 | V |
| | Quality Factor, Q | 5000 | 5000 | — |
| | Nominal Frequency, $f_{nom}$ | 128.202 | 128.202 | MHz |
| | Resonance Frequency, $f_o$ | 128.163 | 128.057 | MHz |
| Equivalent Circuit Variables | Mech. Inductance (mass), $l_x$ | 5.616 | 1.506 | pH |
| | Mech. Capacitance (1/stiffness), $c_x$ | 0.274 | 1.023 | μF |
| | Mech. Resistance (damping), $r_x$ | 0.905 | 0.243 | μΩ |
| | Static Overlap Capacitance, $C_o$ | 55.010 | 55.010 | fF |
| | Electromechanical Coupling Ratio, $\eta_e$ | 11.002 | 11.002 | μC/m |
| | Motional Inductance, $L_x$ | 0.046 | 0.012 | H |
| | Motional Capacitance, $C_x$ | 0.033 | 0.124 | fF |
| | Motional Resistance, $R_x$ | 7.475 | 2.005 | kΩ |
| | $C_x$-to-$C_o$ Capacitive Ratio, $C_x/C_o$ | 0.060 | 0.225 | % |

TABLE 7

Summary Of Variables Of A Symmetric Large-Stem Hollow Disk

| | Parameters | Asymmetric Hollow Disk | Units |
|---|---|---|---|
| Design Variables | Disk Radius (outer), R | 20.6 | μm |
| | Total Height, H | 2.4 | μm |
| | Inner Disk Thickness, h | 500 | nm |
| | Sidewall Thickness, t | 600 | nm |
| | Electrode-to-Resonator Gap, $d_o$ | 50 | nm |
| | Outer Stem Radius, $R_{st}$ | 8 | μm |
| | DC Bias Voltage, $V_P$ | 7 | V |
| | Quality Factor, Q | 1500 | — |
| | Nominal Frequency, $f_{nom}$ | 98.048 | MHz |
| | Resonance Frequency, $f_o$ | 97.837 | MHz |
| Equivalent Circuit Variables | Mech. Inductance (mass), $l_x$ | 1.530 | pH |
| | Mech. Capacitance (1/stiffness), $c_x$ | 1.723 | μF |
| | Mech. Resistance (damping), $r_x$ | 0.628 | μΩ |
| | Static Overlap Capacitance, $C_o$ | 70.364 | fF |
| | Electromechanical Coupling Ratio, $\eta_e$ | 8.857 | μC/m |

TABLE 7-continued

Summary Of Variables Of A Symmetric Large-Stem Hollow Disk

| Parameters | Asymmetric Hollow Disk | Units |
|---|---|---|
| Motional Inductance, $L_x$ | 0.020 | H |
| Motional Capacitance, $C_x$ | 0.135 | fF |
| Motional Resistance, $R_x$ | 8.009 | kΩ |
| Electrical Stiffness Equiv. Cap., $-C_e$ | −31.117 | fF |
| Capacitive Ratio | $C_x/C_e = 0.430\%$   $C_x/C_o = 0.261\%$ | — |

What is claimed is:

1. A capacitive-gap transduced resonator, comprising:
a resonator disk comprising a disk which is symmetrically hollowed with upper and lower cavities and an outer circumferential wall, said disk coupled through a stem to a base structure;
wherein said symmetrically hollowed disk has an outer circumferential wall which protrudes in both upwards and downwards directions;
a first terminal disposed adjacent the disk at a spaced-apart distance defined by an air gap, with said first terminal fully overlapping said outer circumferential wall of said disk; and
a second terminal in proximity to the disk;
wherein the upper and lower cavities of the disk reduces the dynamic mass and stiffness to increase electromechanical coupling of the resonator;
wherein the disk which is symmetrically hollowed to form the upper and lower cavities results in a thin disk having a radius R and a high-aspect-ratio circular edge ring of width of t.

2. The resonator of claim 1, wherein the first terminal comprises a drive electrode and the second terminal comprises a sense electrode.

3. The resonator of claim 1, wherein the resonator disk is configured to operate in radial-contour mode, whispering gallery mode, or wine-glass mode.

4. The resonator of claim 1, wherein the disk provides stiffness and the edge ring increases electrode-to-resonator overlap area while minimizing mass to maximize electromechanical coupling.

5. The resonator of claim 1, wherein the disk is coupled to an interconnect layer via a centrally located stem.

6. The resonator of claim 5, wherein the stem is hollow.

7. The resonator of claim 5, wherein one or more surfaces of the disk comprise a molded structure.

8. The resonator of claim 7, wherein the resonator is fabricated according to steps comprising:
(a) patterning the interconnect layer;
(b) planarizing a surface of the interconnect layer with a polished sacrificial layer and etching a hole in the sacrificial layer for the stem;
(c) depositing and patterning a structural layer for the disk;
(d) conformally depositing a sidewall to the structural layer;
(e) etching the structural layer to define an edge-ring to hollow the disk;
(f) depositing a sidewall sacrificial layer and etching anchor openings for the drive electrode;
(g) depositing and patterning an electrode layer; and
(h) releasing the electrode layer, structural layer, and interconnect layer from the sacrificial layer.

9. The resonator of claim 8, wherein the resonator is fabricated according to the additional step of etching a bottom portion of the structural layer to form a symmetric hollow disk by protruding the edge ring upward and downward.

10. The resonator of claim 1, wherein the resonator disk is symmetric in at least two dimensions.

11. The resonator of claim 1, wherein the resonator has an electromechanical coupling strength $(C_x/C_o)$ of 0.75% at 123 MHz with 40-nm air gap.

12. The resonator of claim 1, wherein the resonator forms a sub-μW low-phase noise reference oscillator.

13. The resonator of claim 1, wherein the resonator forms high-frequency clocking or radar oscillator.

14. The resonator of claim 1, wherein the resonator forms a filter for a low-power wireless transceiver.

15. The resonator of claim 14, wherein the wireless transceiver operates at very high frequency (VHF) and ultra-high frequency (UHF).

* * * * *